United States Patent
Li et al.

(10) Patent No.: US 8,486,540 B2
(45) Date of Patent: Jul. 16, 2013

(54) LEAD FRAME SHEET

(75) Inventors: Ting Li, Tianjin (CN); Qingchun He, Tianjin (CN); Yongqiang Liu, Tianjin (CN)

(73) Assignee: FREESCALE Semiconductor, Inc., Austin, TX (US)

( * ) Notice: Subject to any disclaimer, the term of this patent is extended or adjusted under 35 U.S.C. 154(b) by 254 days.

(21) Appl. No.: 13/008,914

(22) Filed: Jan. 19, 2011

(65) Prior Publication Data

US 2011/0212341 A1     Sep. 1, 2011

(30) Foreign Application Priority Data

Feb. 26, 2010   (CN) .......................... 2010 1 0116814

(51) Int. Cl.
*H01L 23/495*        (2006.01)

(52) U.S. Cl.
USPC ............ 428/573; 428/597; 428/929; 257/666

(58) Field of Classification Search
None
See application file for complete search history.

(56) References Cited

U.S. PATENT DOCUMENTS

| | | | |
|---|---|---|---|
| 5,499,717 A * | 3/1996 | Hayashi | 206/701 |
| 5,801,436 A | 9/1998 | Serizawa | |
| 5,834,691 A * | 11/1998 | Aoki | 174/529 |
| 5,878,890 A * | 3/1999 | Kaneko | 206/714 |
| 6,398,034 B1 * | 6/2002 | Takiar et al. | 206/716 |
| 7,127,805 B2 * | 10/2006 | Watson | 29/827 |
| 7,394,150 B2 | 7/2008 | Kasem | |
| 7,935,575 B2 * | 5/2011 | St. Germain et al. | 438/123 |
| 2003/0104656 A1 * | 6/2003 | Ahmad | 438/123 |
| 2007/0138697 A1 * | 6/2007 | Takeda et al. | 264/278 |
| 2008/0142934 A1 * | 6/2008 | Camacho et al. | 257/666 |
| 2008/0203548 A1 | 8/2008 | Sun | |
| 2009/0051022 A1 | 2/2009 | Andoh | |

FOREIGN PATENT DOCUMENTS

JP         64-20634       *   1/1989

* cited by examiner

*Primary Examiner* — John J Zimmerman
(74) *Attorney, Agent, or Firm* — Charles Bergere

(57) ABSTRACT

A lead frame sheet made of an electrically conductive material has lead frames integrally formed on it. Spacing members also are formed from the sheet. A first one of the spacing members is proximal to a first longitudinal edge of the sheet and a second one of the spacing members is proximal to a second longitudinal edge of the sheet. The spacing members extend from an underside surface of the sheet and, in use, space the underside surface from a planar support such as a surface of a heating block.

15 Claims, 6 Drawing Sheets

LEAD FRAME SHEET

BACKGROUND OF THE INVENTION

The present invention relates to a sheet of lead frames for use in the assembly of semiconductor packages. In particular, the present invention relates to a sheet of lead frames that has integrally formed spacing members for spacing an underside of the sheet from a planar support such as a heating block.

Typical semiconductor packages are formed with a one or more semiconductor dice mounted to a lead frame. The lead frame includes an arrangement of external connection pads (lead fingers) and one or more flags. Semiconductor dice are attached to respective ones of the flags and electrical connections of each dice are electrically coupled, typically by bonded wires, to the external connection pads. The lead frame is normally one of many lead frames that are integrally formed in a conductive sheet by punching or etching. After each semiconductor package is separately encapsulated with an encapsulation material, each of the lead frames is separated (singulated) from all other lead frames in the conductive sheet by a cutting or punching process.

When considering semiconductor packages such as Power Quad Flat No Leads (PQFN) packages and Power Dual Flat No Leads (PDFN) packages, the semiconductor dice have a metallic base and the dice are attached to their respective flags by a solder. The solder is pasted onto the flags and then the semiconductor dice are placed on the solder. The conductive sheet of lead frames is then placed onto a heating block in an oven. The oven heats the solder, causing it to melt, which bonds the semiconductor dice to their respective flags. Unfortunately, when the solder is heated in the oven, some solder may be splashed onto the heating block, which results in solder globules landing on the heating block. These solder globules may attach to undersides of subsequent conductive sheets that are placed on the heating block thereby causing potential shorts, package encapsulating defects and uneven connection pad mounting surfaces. Thus, it would be advantageous to have a way to prevent such shorts, defects and uneven mounting surfaces.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
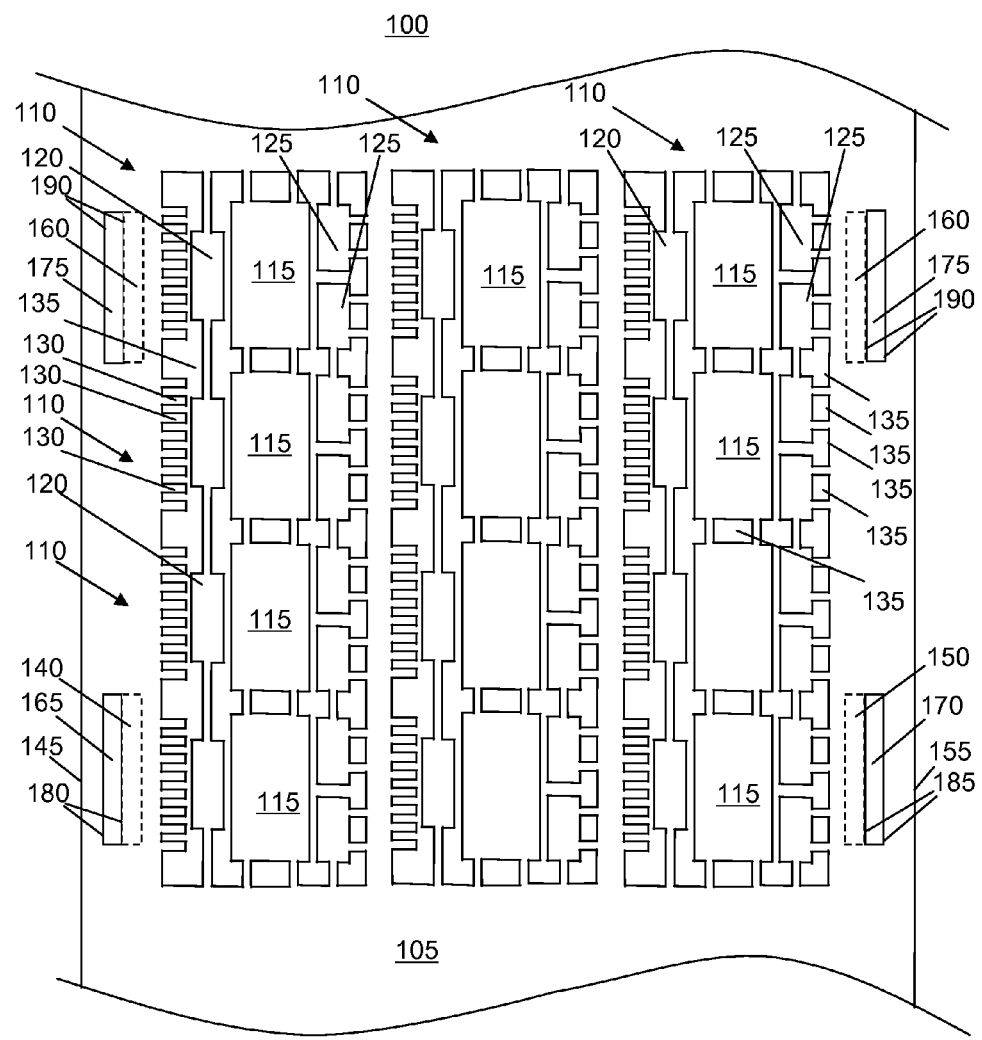
FIG. 1 is a plan view of a sheet of lead frames in accordance with a first preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that system, circuit, device components and method steps that comprises a list of elements or steps does not include only those elements but may include other elements or steps not expressly listed or inherent to such system, circuit, device components or steps. An element or step proceeded by "comprises _a" does not, without more constraints, preclude the existence of additional identical elements or steps that comprises the element or step.

In one embodiment the present invention provides sheet of lead frames comprising an electrically conductive sheet with a plurality of lead frames integrally formed therein. Spacing members are integrally formed from the electrically conductive sheet. A first one of the spacing members being proximal to a first longitudinal edge of the electrically conductive sheet and a second one of the spacing members being proximal to a second longitudinal edge of the electrically conductive sheet. The spacing members extend from an underside surface of the electrically conductive sheet and in use the spacing members space the underside surface from a planar support.

In another embodiment the present invention provides sheet of lead frames comprising an electrically conductive sheet with a plurality of lead frames integrally formed therein. The electrically conductive sheet has an underside surface with a protective sheet removably attached thereto. Spacing members integrally are formed from the electrically conductive sheet. A first one of the spacing members is proximal to a first longitudinal edge of the electrically conductive sheet and a second one of the spacing members is proximal to a second longitudinal edge of the electrically conductive sheet. The spacing members extend from the underside surface of the electrically conductive sheet such that a lengthwise spacing member edge is at a distance of between 5 mm to 10 mm from the underside surface.

Referring now to FIG. 1 there is illustrated a plan view of a sheet of lead frames 100 in accordance with a first preferred embodiment of the present invention. The sheet of lead frames 100 includes an electrically conductive sheet 105 with a plurality of lead frames 110 integrally formed in the sheet 105. As shown each of the lead frames 110 in this specific embodiment is for a Quad Power Quad Flat No Leads (PQFN) package and has a power die flag (mount) 115 and a digital or data die flag (mount) 120. Each of the lead frames 110 has two power pads 125 and a plurality of data pads 130. The power die flag 115, data die flag 120, power pads 125 and data pads 130 are essentially formed by punching or etching suitably shaped slots 135 into the sheet 105.

There are spacing members (shown in phantom) integrally formed from the electrically conductive sheet 105, a first one of the spacing members 140 is proximal to a first longitudinal edge 145 of the electrically conductive sheet 105. A second one of the spacing members 150 is proximal to a second longitudinal edge 155 of the electrically conductive sheet 105. As shown, there can also be further spacing members 160 proximal to either the first or second longitudinal edges 145, 155. In this embodiment, the first one of the spacing members 140 is a wall formed from a punched out area 165 of the electrically conductive sheet 105. Also, the second one of the spacing members 150 is a wall formed from another punched out area 170 of the electrically conductive sheet 105. Similarly, the further spacing members 160 are also walls formed from further punched out areas 175. In this specific embodiment, all the punched out areas 165, 170, 175 are rectangular and respective lengthwise edges 180, 185, 190 of each of the punched out areas 165, 170, 175 are parallel to both the first longitudinal edge 145 and the second longitudinal edge 155. As a result, the spacing members 140, 150, 160 are walls that are parallel to both the first longitudinal edge 145 and the second longitudinal edge 155.

Figure 2:
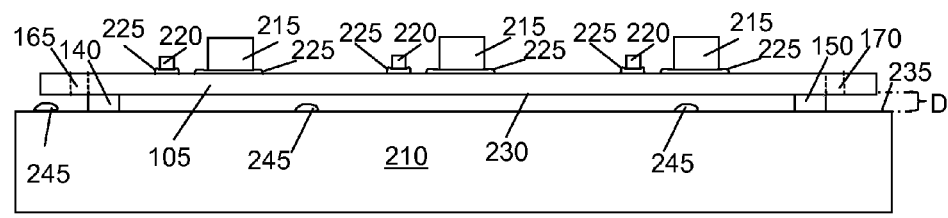
FIG. 2 is an end view of the sheet of lead frames of FIG. 1 when supported on a heating block with semiconductor dies mounted on flags of the lead frames.
Figure 3:
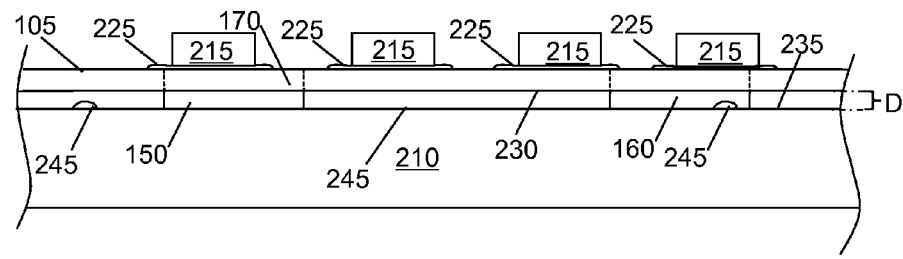
FIG. 3 is a side view of the sheet of lead frames of FIG. 1 when supported on a heating block with semiconductor dies mounted on flags of the lead frames.

Referring to FIGS. 2 and 3, there is illustrated an end view and a side view of the sheet of lead frames 100 when supported on a heating block 210 with semiconductor dies 215 and 220 mounted on the flags 115, 120 of lead frames 110. More specifically, the dies 215 and 220 are mounted onto a solder paste 225 that has been applied onto the flags 115, 120. As illustrated, the spacing members 140, 150 extend from an underside surface 230 of the electrically conductive sheet 105 and in use (when supported on the heating block 210) the spacing members 140, 150, 160 space the underside surface 230 from a planar support. In this regard, the planar support is a surface 235 provided by the heating block 210 and the spacing members 140, 150, 160 space the underside surface 230 from the planar support (surface 235) by a distance D that is typically between 5 mm to 10 mm.

By way of example there are illustrated typical solder splashes, in the form of solder globules 245, that can deposit on the surface 235 of the heating block 210. These solder splashes occur during heating of the solder paste 225 in order to attach the dice 215,220 to their respective flags 115,120. As shown, since the spacing members 140, 150, 160 space the underside surface 230 from the planar support (surface 235) by distance D, the solder globules 245 resulting from solder splashes are not able to attach to the underside surface 230.

Figure 4:
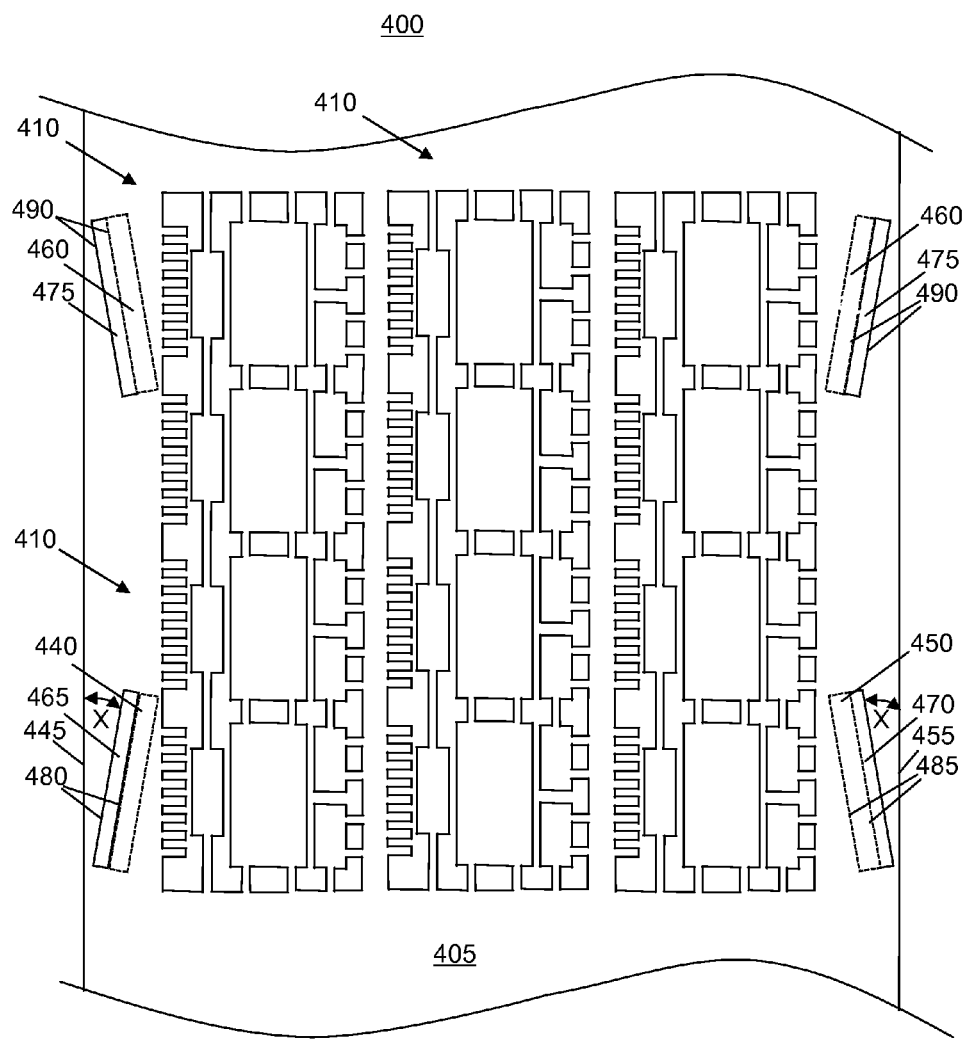
FIG. 4 is a plan view of a sheet of lead frames in accordance with a second preferred embodiment of the present invention.

Referring to FIG. 4 there is illustrated a plan view of a sheet of lead frames 400 in accordance with a second preferred embodiment of the present invention. As most of the sheet of lead frames 400 has been described above with reference to FIGS. 1 to 3, a repetitive description of this sheet of lead frames 400 is not required for one of skill in the art to understand the invention and only the differences will be described. As shown, the sheet of lead frames 400 includes an electrically conductive sheet 405 with a plurality of lead frames 410 integrally formed in the sheet 405. There are spacing members (shown in phantom) integrally formed from the electrically conductive sheet 405, a first one of the spacing members 440 is proximal to a first longitudinal edge 445 of the electrically conductive sheet 405. A second one of the spacing members 450 is proximal to a second longitudinal edge 455 of the electrically conductive sheet 405. As shown, there can also be further spacing members 460 proximal to either the first or second longitudinal edges 445, 455. In this embodiment, the first one of the spacing members 440 is a wall formed from a punched out area 465 of the electrically conductive sheet 405. Also, the second one of the spacing members 450 is a wall formed from another punched out area 470 of the electrically conductive sheet 405. Similarly, the further spacing members 460 are also walls formed from further punched out areas 475. In this specific embodiment, all the punched out areas 465, 470, 475 are rectangular and respective lengthwise edges 480, 485, 490 of each of the punched out areas 465, 470, 475 are at an angle X to both the first longitudinal edge 445, and the second longitudinal edge 455. As a result, the spacing members 440, 450, 460 are walls that are at the angle X to both the first longitudinal edge 445 and the second longitudinal edge 455.

In this embodiment the spacing members 440, 450, 460 again space an underside surface of the electrically conductive sheet 405 from a planar support of a heating block by the distance D. Hence, solder globules resulting from solder splashes are not able to attach to the underside surface of the conductive sheet 405.

Figure 5:
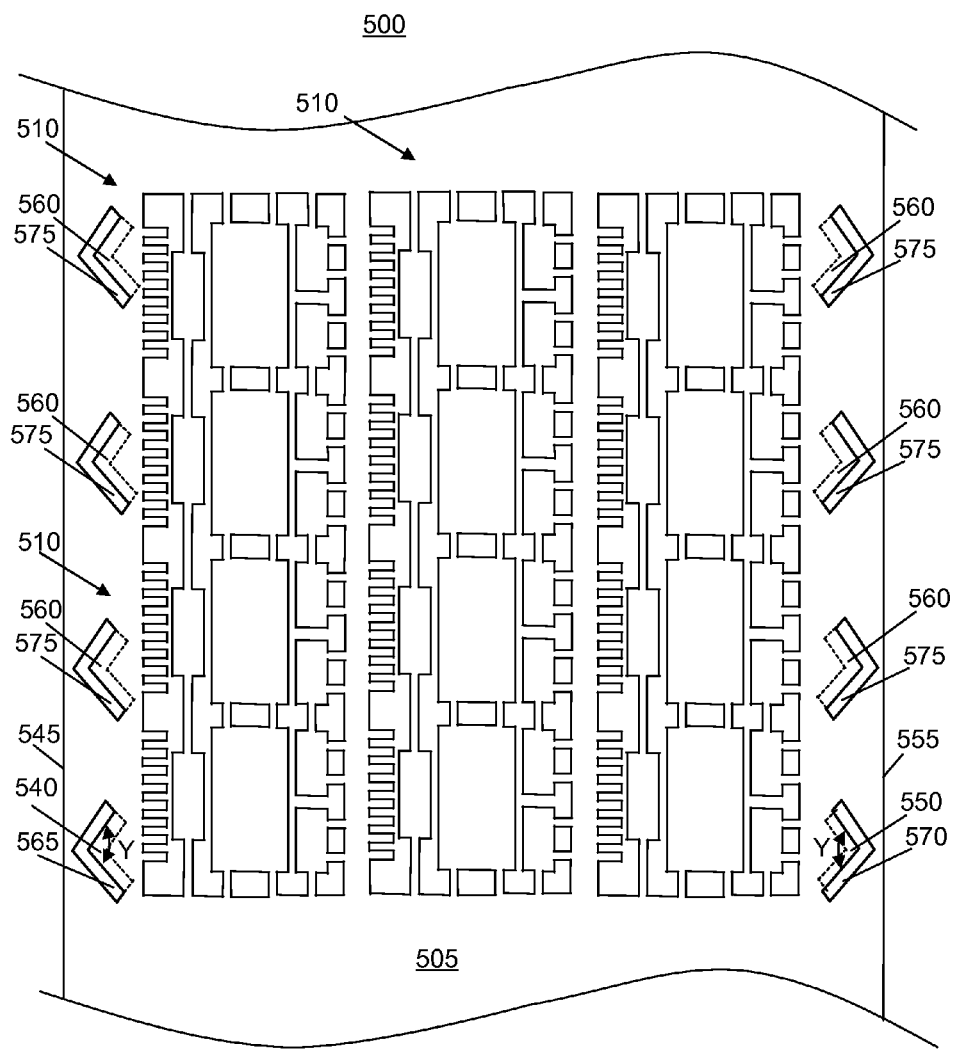
FIG. 5 is a plan view of a sheet of lead frames in accordance with a third preferred embodiment of the present invention.

Referring to FIG. 5 there is illustrated a plan view of a sheet of lead frames 500 in accordance with a third preferred embodiment of the present invention. Again, as most of the sheet of lead frames 500 has been described above with reference to FIGS. 1 to 3, a repetitive description of this sheet of lead frames 500 is not required for one of skill in the art to understand the invention and only the differences will be described. As shown, the sheet of lead frames 500 includes an electrically conductive sheet 505 with a plurality of lead frames 510 integrally formed in the sheet 505. There are spacing members (shown in phantom) integrally formed from the electrically conductive sheet 505, a first one of the spacing members 540 is proximal to a first longitudinal edge 545 of the electrically conductive sheet 505. A second one of the spacing members 550 is proximal to a second longitudinal edge 555 of the electrically conductive sheet 505. As shown, there can also be further spacing members 560 proximal to either the first or second longitudinal edges 545, 555. As shown, the first one of the spacing members 540 is a wall formed from a punched out area 565 of the electrically conductive sheet 505. Also, the second one of the spacing members 550 is a wall formed from another punched out area 570 of the electrically conductive sheet 505. Similarly, the further spacing members 560 are also walls formed from further punched out areas 575. In this specific embodiment, all the punched out areas 565, 570, 575 are rectangular and comprise two rectangles extending away from each other at an angle Y and form an L shape.

Again, in this embodiment the spacing members 540, 550, 560 space an underside surface of the electrically conductive sheet 505 from a planar support of a heating block by the distance D. Hence, solder globules resulting from solder splashes are not able to attach to the underside surface of the conductive sheet 505.

Figure 6:
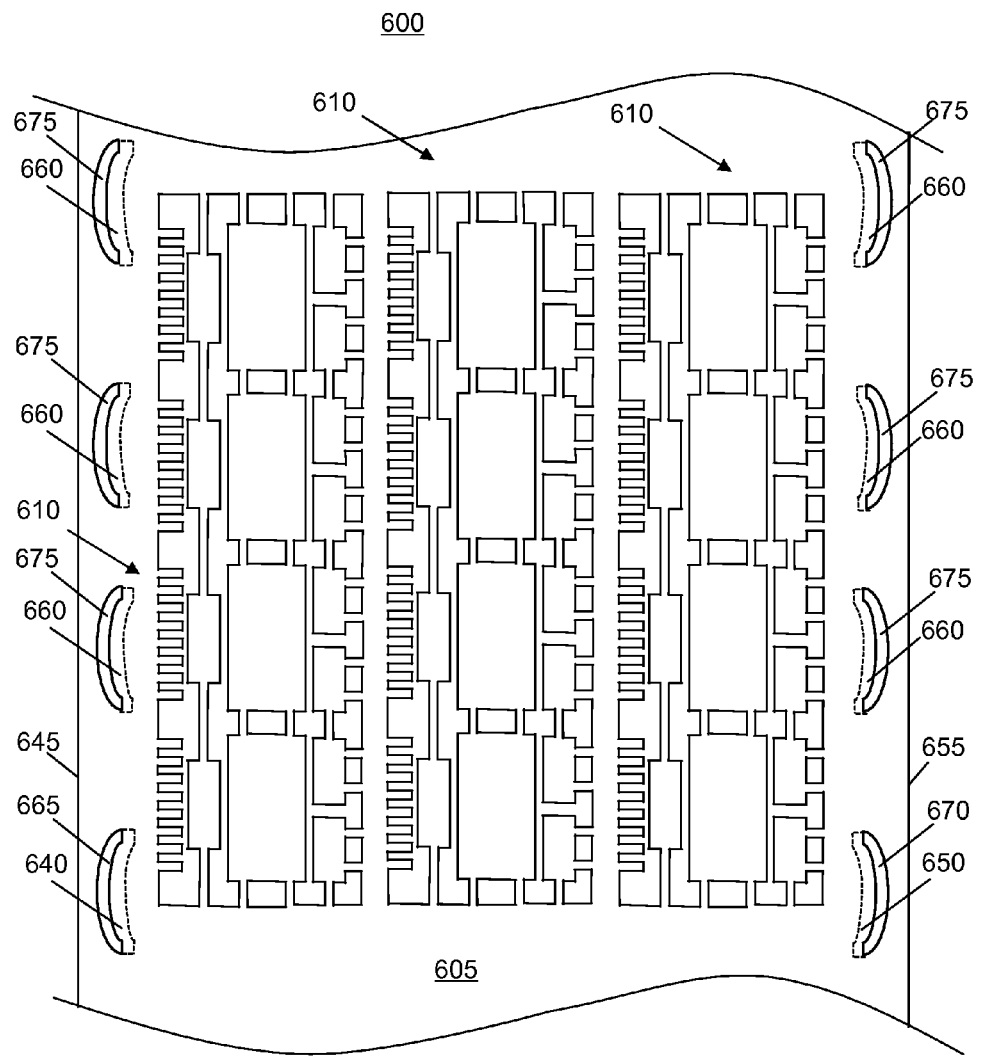
FIG. 6 is a plan view of a sheet of lead frames in accordance with a fourth preferred embodiment of the present invention.

Referring to FIG. 6 there is illustrated a plan view of a sheet of lead frames 600 in accordance with a fourth preferred embodiment of the present invention. Again, as most of the sheet of lead frames 600 has been described above with reference to FIGS. 1 to 3, a repetitive description of this sheet of lead frames 600 is not required for one of skill in the art to understand the invention and only the differences will be described. As shown, the sheet of lead frames 600 includes an electrically conductive sheet 605 with a plurality of lead frames 610 integrally formed in the sheet 605. There are spacing members (shown in phantom) integrally formed from the electrically conductive sheet 605, a first one of the spacing members 640 is proximal to a first longitudinal edge 645 of the electrically conductive sheet 605. A second one of the spacing members 650 is proximal to a second longitudinal edge 655 of the electrically conductive sheet 605. As shown, there can also be further spacing members 660 proximal to either the first or second longitudinal edges 645, 655. As shown, the first one of the spacing members 640 is a wall formed from a punched out area 665 of the electrically conductive sheet 605. Also, the second one of the spacing members 650 is a wall formed from another punched out area 670 of the electrically conductive sheet 605. Similarly, the further spacing members 660 are also walls formed from further punched out areas 675. In this specific embodiment, all the punched out areas 665, 670, 675 are arcuate and resemble part of an annular slot.

Again, in this embodiment the spacing members 640, 650, 660 space an underside surface of the electrically conductive sheet 605 from a planar support of a heating block by the distance D. Hence, solder globules resulting from solder splashes are not able to attach to the underside surface of the conductive sheet 605.

Figure 7:
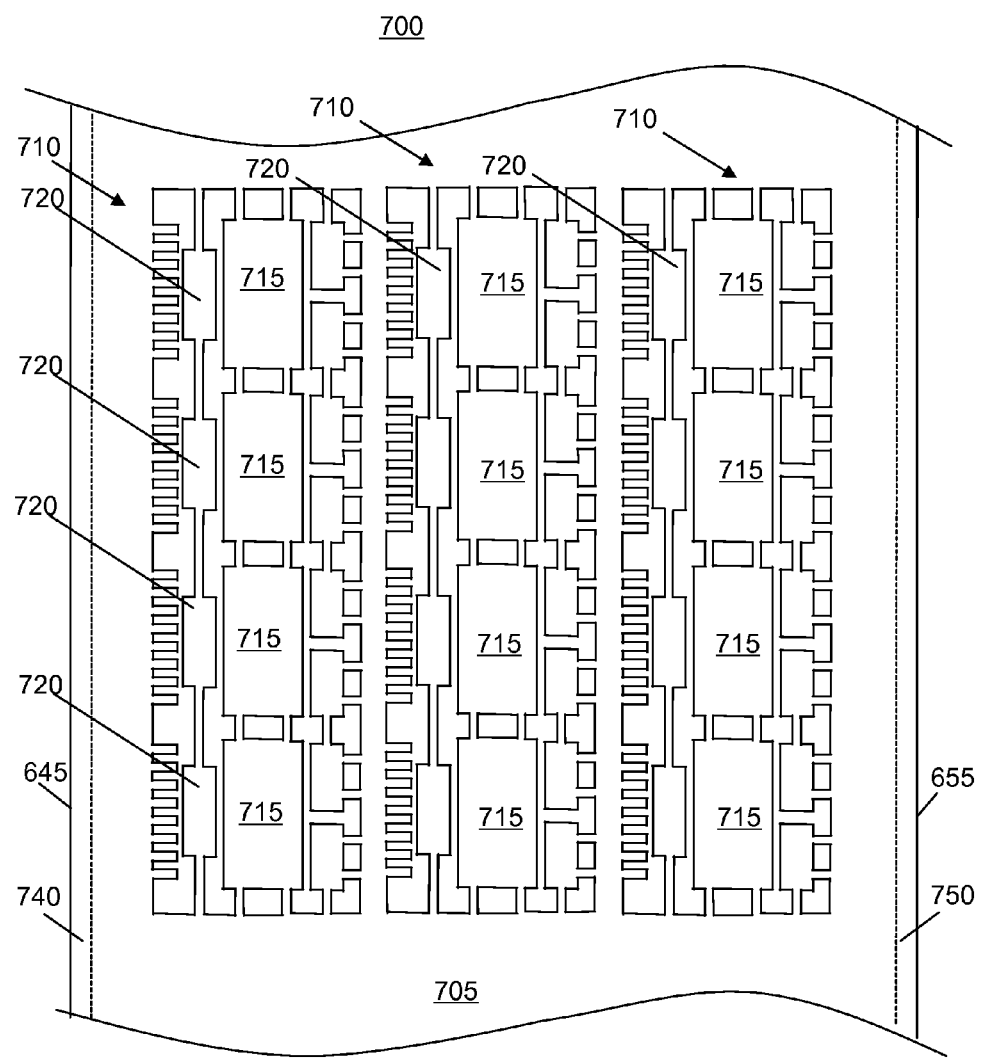
FIG. 7 is a plan view of a sheet of lead frames in accordance with a fifth preferred embodiment of the present invention.

Referring to FIG. 7 there is illustrated a plan view of a sheet of lead frames 700 in accordance with a fifth preferred embodiment of the present invention. Again, as most of the sheet of lead frames 700 has been described above with reference to FIGS. 1 to 3, a repetitive description of this sheet of lead frames 700 is not required for one of skill in the art to understand the invention and only the differences will be described. As shown, the sheet of lead frames 700 includes an electrically conductive sheet 705 with a plurality of lead frames 710 integrally formed in the sheet 705. Each of the lead frames 710 includes a power die flag (mount) 715 and a digital or data die flag (mount) 720. There are spacing members (shown in phantom) integrally formed from the electrically conductive sheet 705, a first one of the spacing members 740 is proximal to a first longitudinal edge 745 of the electrically conductive sheet 705. A second one of the spacing members 750 is proximal to a second longitudinal edge 755 of the electrically conductive sheet 705.

Figure 8:
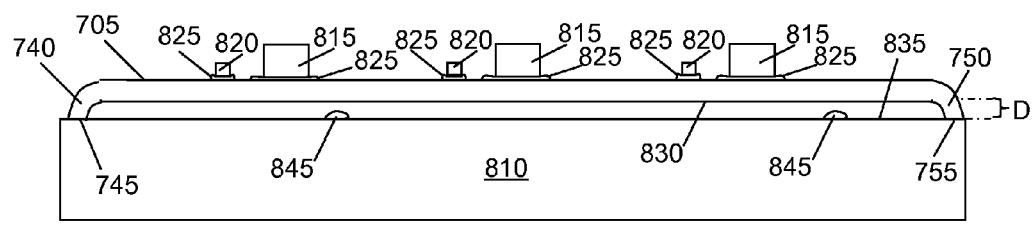
FIG. 8 is an end view of the sheet of lead frames of FIG. 7 when supported on a heating block with semiconductor dies mounted on flags of the lead frames.

Referring to FIG. 8 there is illustrated an end view of the sheet of lead frames 700 when supported on a heating block 810 with semiconductor dies 815 and 820 mounted on the flags 715, 720 of the lead frames 710. As clearly shown, the first one of the spacing members 740 is formed by a bend in the electrically conductive sheet 705 so that the first longitudinal edge 745 provides a support surface of the first one of the spacing members 740. Similarly, the second one of the spacing members 750 is formed by a bend in the electrically conductive sheet 705 so that the second longitudinal edge 755 provides a support surface of the second one of the spacing members 750. More specifically, in this embodiment the first one of the spacing members 740 extends along a full length of the first longitudinal edge 745 and the second one of the spacing members 750 extends along a full length of the second longitudinal edge 755. However, as will be apparent to a person skilled in the art, the first and second spacing members 740, 750 may not necessarily extend along their respective full lengths of the longitudinal edges 745, 755.

Again in this embodiment, the dies 815 and 820 are mounted onto a solder paste 825 that has been applied onto the flags 715, 720. As illustrated, the spacing members 740, 750 extend from an underside surface 830 of the electrically conductive sheet 705 and in use (when supported on the heating block 810) the spacing members 740, 750 space the underside surface 830 from a planar support. In this regard, the planar support is a surface 835 provided by the heating block 810 and the spacing members 840, 850 space the underside surface 830 from the planar support (surface 835) by the distance D that is typically between 5 mm to 10 mm.

As shown by way of example again are typical solder splashes, in the form of solder globules 845, that can deposit on the surface 835 of the heating block 810. As shown, since the spacing members 840, 850 space the underside surface 830 from the planar support (surface 835) by distance D, the solder globules 845 resulting from solder splashes are not able to attach to the underside surface 830.

Advantageously, the spacing members of the present invention space the underside of the sheet of lead frames from the heating block. Consequently, the present invention alleviates the problems of undesirable solder globules (resulting from solder splashes) attaching to an underside of the sheet of lead frames. Accordingly, the possibility of potential shorts, package encapsulating defects and uneven connection pad mounting surfaces attributed to solder splashes is reduced.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A lead frame sheet, comprising:
   an electrically conductive sheet having an upper side surface and an under side surface, the electrically conductive sheet including a plurality of lead frames integrally formed therein and side rails along longitudinal edges of the conductive sheet and surrounding the plurality of lead frames; and
   spacing members integrally formed in the side rails of the electrically conductive sheet, a first one of the spacing members being proximal to a first longitudinal edge of the electrically conductive sheet and a second one of the spacing members being proximal to a second longitudinal edge of the electrically conductive sheet, wherein the first one of the spacing members is a wall formed from a punched out area of the electrically conductive sheet, and the spacing members are isolated from the lead frames and extend along the under side surface of the electrically conductive sheet, and in use the spacing members space the under side surface of the electrically conductive sheet from a planar support.

2. The lead frame sheet of claim 1, wherein the first one of the spacing members is formed by a bend in the electrically conductive sheet so that the first longitudinal edge provides a support surface of the first one of the spacing members.

3. The lead frame sheet of claim 2, wherein the second one of the spacing members is formed by a bend in the electrically conductive sheet so that the second longitudinal edge provides a support surface of the second one of the spacing members.

4. The lead frame sheet of claim 1, wherein the second one of the spacing members is a wall formed from another punched out area of the electrically conductive sheet.

5. The lead frame sheet of claim 1, wherein the punched out area is rectangular.

6. The lead frame sheet of claim 5, wherein lengthwise edges of the punched out area are parallel to the first longitudinal edge.

7. The lead frame sheet of claim 5, wherein lengthwise edges of the punched out area are at an angle to the first longitudinal edge.

8. The lead frame sheet of claim 1, wherein the punched out area is arcuate.

9. The lead frame sheet of claim 1, wherein the punched out area comprises two rectangles extending away from each other at an angle.

10. The lead frame sheet of claim 9, wherein the two rectangles form an L shape.

11. The lead frame sheet of claim 1, wherein in use the spacing members space the under side surface from a planar support by a distance of between 5 mm to 10 mm.

12. A lead frame sheet, comprising:
- an electrically conductive sheet with a plurality of lead frames integrally formed therein and side rails along longitudinal edges of the conductive sheet that surround the plurality of lead frames, the electrically conductive sheet having an underside surface with a protective sheet removably attached thereto; and
- spacing members integrally formed in the side rails of the electrically conductive sheet, a first one of the spacing members being proximal to a first longitudinal edge of the electrically conductive sheet and a second one of the spacing members being proximal to a second longitudinal edge of the electrically conductive sheet, wherein the first one of the spacing members is a wall formed from a punched out area of the electrically conductive sheet,
- and the spacing members are isolated from the lead frames and extend from the underside surface of the electrically conductive sheet such that a lengthwise spacing member edge is at a distance of between 5 mm to 10 mm from the underside surface.

13. The lead frame sheet of claim 12, wherein the first one of the spacing members is formed by a bend in the electrically conductive sheet so that the first longitudinal edge provides a support surface of the first one of the spacing members.

14. The lead frame sheet of claim 12, wherein the punched out area is rectangular.

15. The lead frame sheet of claim 12, wherein the punched out area is arcuate.

\* \* \* \* \*